(12) United States Patent  
Singh et al.

(10) Patent No.: US 9,059,693 B2
(45) Date of Patent: Jun. 16, 2015

(54) CLOCK GATING CIRCUIT

(71) Applicants: Rahul Singh, Yongin-si (KR); Min-Su Kim, Hwaseong-si (KR)

(72) Inventors: Rahul Singh, Yongin-si (KR); Min-Su Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 13/834,603

(22) Filed: Mar. 15, 2013

(65) Prior Publication Data

US 2014/0247077 A1 Sep. 4, 2014

(30) Foreign Application Priority Data

Mar. 4, 2013 (KR) .................. 10-2013-0022606

(51) Int. Cl.
*H03K 3/037* (2006.01)
*H03K 3/356* (2006.01)

(52) U.S. Cl.
CPC ............. *H03K 3/356* (2013.01); *H03K 3/037* (2013.01); *H03K 3/356104* (2013.01)

(58) Field of Classification Search
USPC ......... 327/199, 200, 208, 210–212, 214, 215, 327/218; 326/93, 95–98
See application file for complete search history.

(56) References Cited

U.S. PATENT DOCUMENTS

| 5,898,330 | A | 4/1999 | Klass | |
|---|---|---|---|---|
| 6,204,707 | B1 * | 3/2001 | Hamada et al. | 327/202 |
| 6,278,308 | B1 | 8/2001 | Partovi et al. | |
| 6,937,079 | B1 | 8/2005 | Zhao et al. | |
| 7,365,575 | B2 * | 4/2008 | Kim | 326/95 |
| 7,528,630 | B2 | 5/2009 | Kim et al. | |
| 7,671,653 | B2 | 3/2010 | Harris et al. | |
| 7,872,514 | B2 * | 1/2011 | Chee | 327/218 |
| 7,961,024 | B1 | 6/2011 | Lin et al. | |
| 8,436,669 | B2 * | 5/2013 | Alben et al. | 327/218 |
| 8,487,681 | B2 * | 7/2013 | Dally et al. | 327/218 |
| 8,508,275 | B2 * | 8/2013 | Sathianthan | 327/202 |
| 2006/0244502 | A1 | 11/2006 | Kim | |
| 2008/0238514 | A1 | 10/2008 | Kim | |

FOREIGN PATENT DOCUMENTS

| JP | 2007336482 A | 12/2007 |
|---|---|---|
| KR | 100305710 B1 | 9/2001 |
| KR | 1020090059580 A | 6/2009 |

* cited by examiner

*Primary Examiner* — Patrick O'Neill
(74) *Attorney, Agent, or Firm* — Sughrue Mion, PLLC

(57) ABSTRACT

Provided is a semiconductor circuit. The semiconductor circuit includes a pulse generator which is enabled by a rising edge of a clock signal and generates a read pulse which varies depending on a voltage of a feedback node; and a sense amplifier which generates a voltage of a dynamic node and the voltage of the feedback node in accordance with a data value of an input signal using the read pulse.

28 Claims, 15 Drawing Sheets

1000

CLOCK GATING CIRCUIT

This application claims priority from Korean Patent Application No. 10-2013-0022606 filed on Mar. 4, 2013 in the Korean Intellectual Property Office, the disclosure of which is incorporated herein by reference in its entirety.

BACKGROUND

1. Field

Exemplary embodiments relate to a semiconductor circuit.

2. Description of the Related Art

Flip-flop circuits and clock gating cell circuits, which are examples of semiconductor circuits, are critical to the improvement of the performance of microprocessors. Flip-flop circuits store and sequentially transmit an input signal in response to a clock signal or a pulse signal. Clock gating cell circuits either provide a clock signal or block the transmission of the clock signal, to a particular circuit so as to reduce a power consumption of the particular circuit.

SUMMARY

Aspects of the exemplary embodiments may provide a semiconductor circuit which can be miniaturized and operate reliably, even at a low voltage.

However, aspects of the exemplary embodiments are not restricted. The above and other aspects of the exemplary embodiments will become more apparent to one of ordinary skill in the art to which the exemplary embodiments pertain by referencing the detailed description of the exemplary embodiments given below.

According to an aspect of the exemplary embodiments, there is provided a semiconductor circuit including: a pulse generator which is enabled by a rising edge of a clock signal and generates a read pulse which varies depending on a voltage of a feedback node; and a sense amplifier which generates a voltage of a dynamic node and the voltage of the feedback node in accordance with a data value of an input signal using the read pulse.

According to another aspect of the exemplary embodiments, there is provided a semiconductor circuit including: a read circuit which is provided with a clock signal at a first level, generates a read pulse which varies depending on a data value of an input signal, and reads the data value of the input signal using the read pulse; and a buffer circuit which buffers a signal output from the read circuit and outputs the buffered output signal.

According to another aspect of the exemplary embodiments, the is provided a semiconductor circuit including: a pulse generator which generates a read pulse which varies depending on a voltage of a feedback node; a first transistor stack which generates a voltage of a dynamic node such that the dynamic node has different levels, depending on a data value of an input signal; a second transistor stack which generates the voltage of the feedback node such that the feedback node has different levels, depending on the data value of the input signal; and a discharge transistor which is configured to pull down the voltages of the dynamic node and the feedback node by being gated to the read pulse.

According to another aspect of the exemplary embodiments, there is provided a semiconductor circuit including: a pulse generator which is enabled by a rising edge of a clock signal, and generates a read pulse which varies depending on a voltage of a feedback node; and a sense amplifier which generates a voltage of a dynamic node and the voltage of the feedback node in accordance with a data value of an enable signal using the read pulse.

BRIEF DESCRIPTION OF THE DRAWINGS

The above and other aspects and features of the exemplary embodiments will become more apparent by describing in detail exemplary embodiments with reference to the attached drawings, in which.

DETAILED DESCRIPTION OF THE EXEMPLARY EMBODIMENTS

Figure 1:
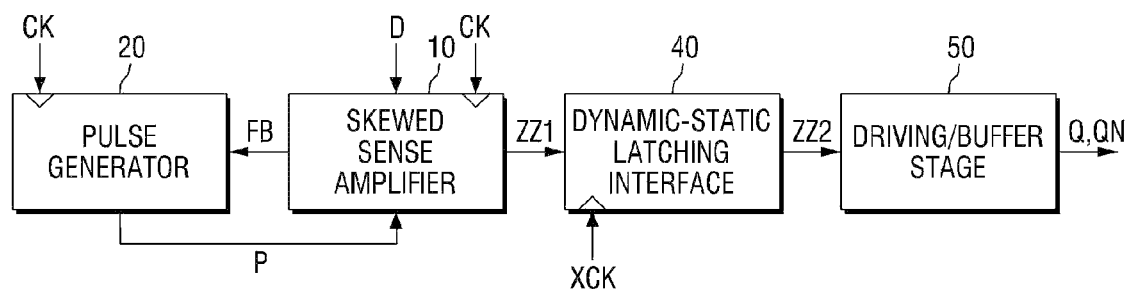
FIG. 1 is a block diagram of a semiconductor circuit according to an embodiment.

Advantages and features of the exemplary embodiments and methods of accomplishing the same may be understood more readily by reference to the following detailed description of preferred embodiments and the accompanying drawings. The present embodiment may, however, be embodied in many different forms, and should not be construed as being limited to the embodiments set forth herein. Rather, these embodiments are provided so that this disclosure will be thorough and complete and will fully convey the concept of the exemplary embodiments to those skilled in the art. The exemplary embodiments will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

The use of the terms "a" and "an" and "the" and similar referents in the context of describing the exemplary embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the exemplary embodiments.

Unless defined otherwise, all technical and scientific terms used herein have the same meaning as commonly understood by one of ordinary skill in the art to which these exemplary embodiments belong. It is noted that the use of any and all examples, or exemplary terms provided herein is intended merely to better illuminate the exemplary embodiments and is not a limitation on the scope of the exemplary embodiments unless otherwise specified. Further, unless defined otherwise, all terms defined in generally used dictionaries may not be overly interpreted.

A semiconductor circuit according to an embodiment will now be described with reference to FIGS. 1 through 6.

Figure 2:
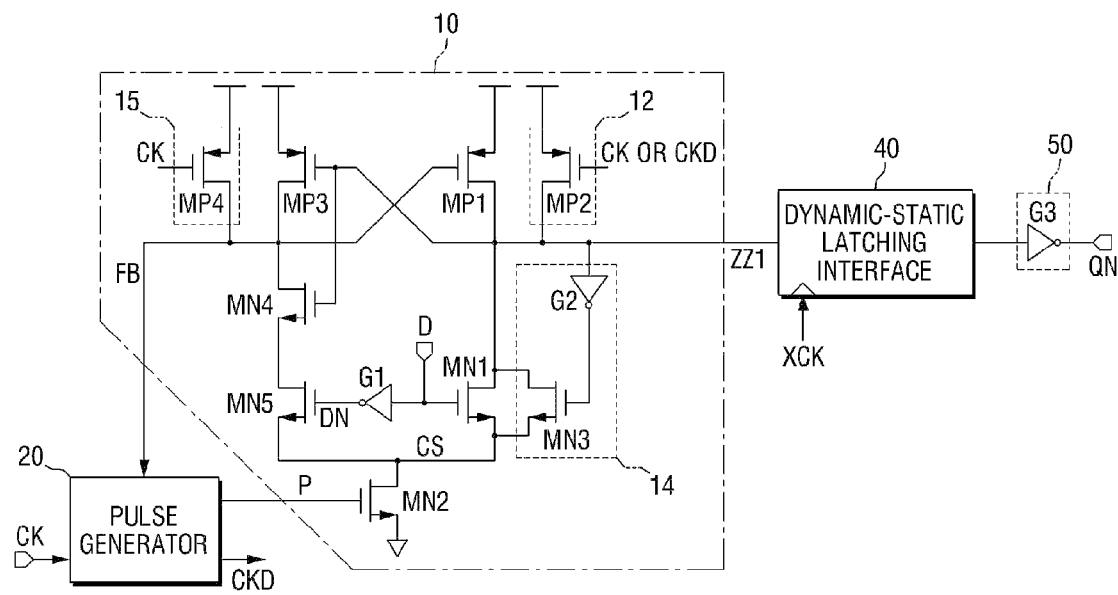
FIG. 2 is a detailed circuit diagram of the semiconductor circuit shown in FIG. 1.
Figure 3:
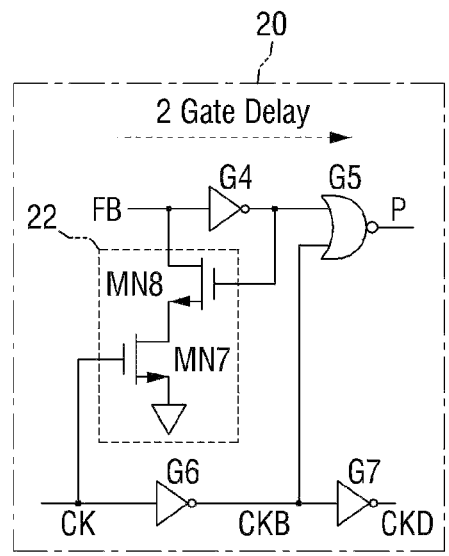
FIG. 3 is a detailed circuit diagram of an example of a pulse generator shown in FIG. 1.
Figure 4:
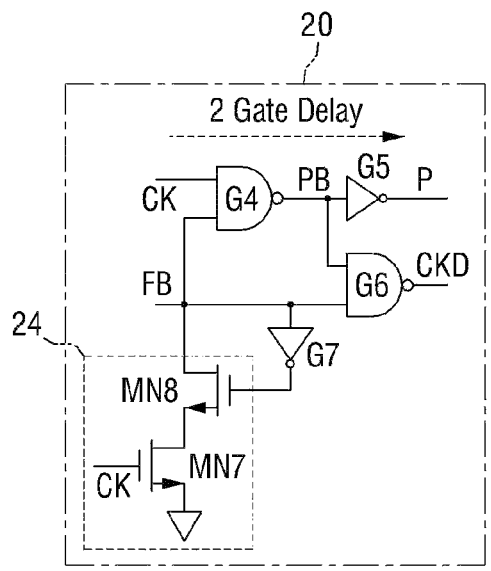
FIG. 4 is a detailed circuit diagram of another example of the pulse generator shown in FIG. 1.
Figure 5:
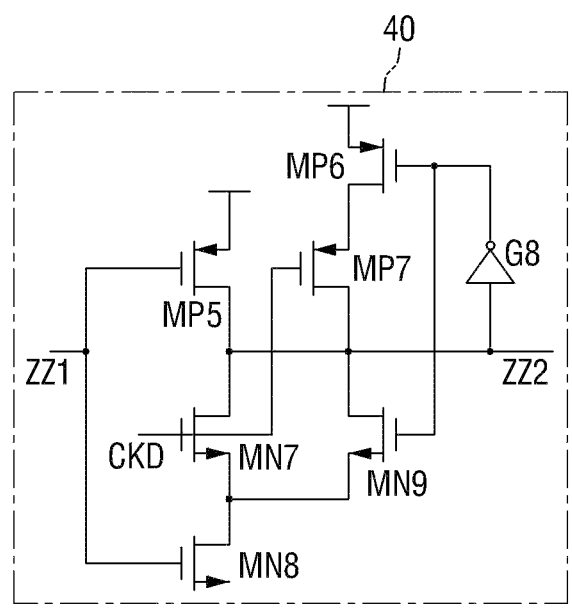
FIG. 5 is a detailed circuit diagram of an example of a latch circuit shown in FIG. 1.
Figure 6:
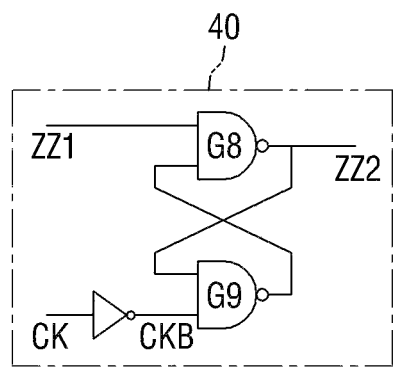
FIG. 6 is a detailed circuit diagram of another example of the latch circuit shown in FIG. 1.

FIG. 1 is a block diagram of a semiconductor circuit according to an embodiment. FIG. 2 is a detailed circuit diagram of the semiconductor circuit shown in FIG. 1. FIG. 3 is a detailed circuit diagram of an example of a pulse generator shown in FIG. 1. FIG. 4 is a detailed circuit diagram of another example of the pulse generator shown in FIG. 1. FIG. 5 is a detailed circuit diagram of an example of a latch circuit shown in FIG. 1. FIG. 6 is a detailed circuit diagram of another example of the latch circuit shown in FIG. 1.

Referring to FIGS. 1 and 2, a semiconductor circuit 1 includes a read circuit (10, 20), a latch circuit 40, and a buffer circuit 50.

In an example, the semiconductor circuit 1 may be a flip-flop circuit. However, exemplary embodiments are not restricted to a flip-flop circuit. In other words, exemplary embodiments can be applied to various other semiconductor circuits other than a flip-flop circuit.

The read circuit (10, 20) may be provided with a clock signal CK with a first level (for example, a logic high level), may generate a read pulse P, which varies depending on the data value of an input signal D, and may read the data value of the input signal D by using the read pulse P. The read circuit (10, 20) may include a sense amplifier 10 and a pulse generator 20.

The sense amplifier 10 may develop the voltages of a dynamic node ZZ1 and a feedback node FB, based on the data value of the input signal D by using the read pulse P generated by the pulse generator 20.

The sense amplifier 10 may include a first transistor stack (MP1, MN1), which is used to develop the voltage level of the dynamic node ZZ1 based on the data value of the input signal D, a second transistor stack (MP3, MN4, MN5), which is used to develop the voltage of the feedback node FB based on the data value of the input signal D, and a discharge transistor MN2, which is used to pull down the voltages at the dynamic node ZZ1 and the feedback node FB by being gated by the read pulse P generated by the pulse generator 20.

The first transistor stack (MP1, MN1) includes a first p-channel metal-oxide-semiconductor (PMOS) transistor MP1, which connects a power source and the dynamic node ZZ1 by being gated by the voltage of the feedback node FB, and a first n-channel metal-oxide-semiconductor (NMOS) transistor MN1, which connects the dynamic node ZZ1 and the discharge transistor MN2 by being gated by the data value of the input signal D. The discharge transistor MN2 and the first NMOS transistor MN1 may be connected to a common node CS, as shown in FIG. 2.

The second transistor stack (MP3, MN4, MN5) may include a third PMOS transistor MP3, which connects the power source and the feedback node FB by being gated by the voltage of the dynamic node ZZ1, a fourth NMOS transistor MN4, which connects the feedback node FB and a fifth NMOS transistor MN5 by being gated by the voltage of the dynamic node ZZ1, and the fifth NMOS transistor MN5, which connects the fourth NMOS transistor MN4 and the discharge transistor MN2 by being gated by the data value of an inverted input signal DN. The inverted input signal DN may be an inverted signal obtained by passing the input signal D through a first gate G1, which includes, for example, an inverter. As shown in FIG. 2, the discharge transistor MN2 and the fifth NMOS transistor MN5 may also be connected to the common node CS. In other words, the first transistor stack (MP1, MN1) and the second transistor stack (MP3, MN4, MN5) may share the common node CS with each other.

The discharge transistor MN2 may connect the common node CS and a ground source by being gated by the read pulse P, which is generated by the pulse generator 20. In an example, the discharge transistor MN2 may include an NMOS transistor.

The sense amplifier 10 may be a skewed sense amplifier.

The sense amplifier 10 may be skewed in terms of the size of transistors in each transistor stack.

More specifically, the size of the transistors of the first transistor stack may differ from the size of the transistors of the second transistor stack (MP3, MN4, MN5). In an example, the transistors of the first transistor stack (MP1, MN1) may be larger in size than the transistors of the second transistor stack (MP3, MN4, MN5).

In this example, the second transistor stack (MP3, MN4, MN5) may occupy a smaller area than the first transistor stack (MP1, MN1). Accordingly, the area of the sense amplifier 10 may be reduced due to the second transistor stack (MP3, MN4, MN5), including transistors that are generally small in size. In other words, the semiconductor circuit 1 may be miniaturized.

In general, circuits consisting of transistors that are small in size may be slow in processing signals. However, in the example shown in FIGS. 1 and 2, the second transistor stack (MP3, MN4, MN5) develops the voltage of the feedback node FB, not the voltage of the dynamic node ZZ1. Accordingly, it is possible to miniaturize the semiconductor circuit 1 without adversely affecting the general performance of the semiconductor circuit 1.

The sense amplifier 10 may also be skewed in terms of the number of transistors in each transistor stack.

More specifically, the number of transistors in the first transistor stack (MP1, MN1) may be different from the number of transistors in the second transistor stack (MP3, MN4, MN5). As shown in FIG. 2, as an example, the first transistor stack (MP1, MN1) may include two transistors, and the second transistor stack (MP3, MN4, MN5) may include three transistors.

In this example, i.e., in the case of configuring the first transistor stack (MP1, MN1) to include fewer transistors than the second transistor stack (MP3, MN4, MN5), a signal path for reading the data value of the input signal D may be simplified. Thus a data read operation may be reliably performed.

The sense amplifier 10 may also include first, second, and third keeper circuits 12, 14, and 15.

The first keeper circuit 12 may maintain the voltage of the dynamic node ZZ1 at the first level (for example, the logic high level). The first keeper circuit 12 may include a second PMOS transistor MP2, which connects the power source and the dynamic node ZZ1 by being gated by the clock signal CK or a delayed clock signal CKD.

The second keeper circuit 14 may maintain the voltage of the dynamic node ZZ1 at a second level (for example, a logic low level). To invert the voltage of the dynamic node ZZ1, the second keeper circuit 14 may include a second gate G2, which includes, for example, an inverter, and a third NMOS transistor MN3, which connects the dynamic node ZZ1, and the common node CS by being gated by the output of the second gate G2.

The third keeper circuit 15 may maintain the voltage of the feedback node FB at the first level (for example, the logic high level). The third keeper circuit may include a fourth PMOS transistor MP4, which connects the power source and the feedback node FB by being gated by the clock signal CK.

The pulse generator 20 may generate the read pulse P, which varies depending on the voltage of the feedback node FB, by being enabled by the rising edge of the clock signal CK. In an example, the pulse generator 20 may generate a read pulse P with a first width in response to the voltage of the feedback node FB having the first level (for example, the logic high level), or may generate a read pulse P with a second width, which is smaller than the first width, in response to the voltage of the feedback node FB having the second level (for example, the logic low level).

In an example, the pulse generator 20 may have a structure shown in FIG. 3.

Referring to FIG. 3, the pulse generator 20 may include fourth to seventh gates G4 to G7, and a fourth keeper circuit 22.

The sixth gate G6 may include, e.g., an inverter. The sixth gate G6 may obtain an inverted clock signal CKB by inverting the clock signal CK, and may provide the inverted clock signal CKB to the seventh gate G7. The seventh gate G7 may include, e.g., an inverter. The seventh gate G7 may obtain the delayed clock signal CKD by inverting the inverted clock signal CKB, and may provide the delayed clock signal CKD to the sense amplifier 10.

The fourth gate G4 may include, e.g., an inverter. The fourth gate G4 may invert the voltage of the feedback node FB, and may provide the inverted voltage of the feedback node FB to the fifth gate G5. The fifth gate G5 may obtain the read pulse P by performing a negative OR (NOR) operation on the output of the fourth gate G4 and the output of the sixth gate G6. The read pulse P may be provided to the sense amplifier 10. Thus, the read pulse P may be used for the sense amplifier 10 to read the data value of the input signal D.

The fourth keeper circuit 22 may maintain the voltage of the feedback node FB at the second level (for example, the logic low level). The fourth keeper circuit 22 may include an eighth NMOS transistor MN8, which connects the feedback node FB and a seventh NMOS transistor MN7 by being gated by the output of the fourth gate G4, and the seventh NMOS transistor MN7, which connects the eighth NMOS transistor MN8 and the ground source by being gated by the clock signal CK. As shown in FIG. 3, the fourth keeper circuit 22 may be included in the pulse generator 20.

As shown in FIG. 3, due to the structure of the pulse generator 20, the read pulse P may be delayed for a predetermined amount of time after the rising edge of the clock signal CK. Such a delay in the read pulse P may be generated by two gates included in the pulse generator 20, e.g., the sixth and seventh gates G6 and G5. As shown in FIG. 3, due to the structure of the pulse generator 20, the clock signal CK may be delayed for a "two-gate delay" time by the sixth and seventh gates G6 and G7, thereby obtaining the delayed clock signal CKD.

In another example, the pulse generator 20 may have a structure shown in FIG. 4.

Referring to FIG. 4, the pulse generator 20 may include fourth to seventh gates G4 to G7, and a fourth keeper circuit 24.

The fourth gate G4 may perform a negated AND (NAND) operation on the voltage of the clock signal CK and the voltage of the feedback node FB, and may output the result of the NAND operation to the fifth gate G5. For example, the output of the fourth gate G4 may be an inverted read pulse PB. The fifth gate G5 may include, for example, an inverter. The fifth gate G5 may obtain the read pulse P by inverting the inverted read pulse PB, and may output the read pulse P. The read pulse P may be provided to the sense amplifier 10 and may thus be used for the sense amplifier 10 to read the data value of the input signal D.

The sixth gate G6 may obtain the delayed clock signal CKD by performing a NAND operation on the voltage of the feedback node FB and the voltage of the inverted read pulse PB, and may output the delayed clock signal CKD. The delayed clock signal CKD may be provided to the sense amplifier 10.

The seventh gate G7 may include, e.g., an inverter. The seventh gate G7 may invert the voltage of the feedback node FB, and may provide the inverted voltage of the feedback node FB to the fourth keeper circuit 24.

The fourth keeper circuit 24 may maintain the voltage of the feedback node at the second level (for example, the logic low level). The fourth keeper circuit 24 may include an eighth NMOS transistor MN8, which connects the feedback node FB and a seventh NMOS transistor MN7 by being gated by the output of the seventh gate G7, and the seventh NMOS transistor MN7, which connects the eighth NMOS transistor MN8 and the ground source by being gated by the clock signal CK. As shown in FIG. 4, the fourth keeper circuit 24 may be included in the pulse generator 20.

As shown in FIG. 4, due to the structure of the pulse generator 20, the read pulse P may be delayed for a predetermined amount of time after the rising edge of the clock signal CK. Such a delay in the read pulse P may be generated by two gates included in the pulse generator 20, e.g., the fourth and fifth gates G4 and G5. As shown in FIG. 4, due to the structure of the pulse generator 20 as shown in FIG. 4, the clock signal CK may be delayed for a "two-gate delay" time by the fourth and sixth gates G4 and G6, thereby obtaining the delayed clock signal CKD.

The latch circuit 40 may latch the data value of the input signal D, which is read by the read circuit (10, 20). The latch circuit 40 may interface the dynamic node ZZ1 and a static node ZZ2.

As shown in FIG. 5, as an example, the latch circuit 40 may be a pseudo static latch.

Referring to FIG. 5, the latch circuit 40 may include a clock-based inverter (MP5, MN7, MN8), a ninth NMOS transistor MN9, sixth and seventh PMOS transistors MP6 and MP7, and an eighth gate G8, which includes, for e.g., an inverter.

The clock-based inverter (MP5, MN7, MN8) may include a fifth PMOS transistor MP5 and seventh and eighth NMOS transistors MN7 and MN8, which are connected in series between the power source and the ground source. The fifth PMOS transistor MP5 and the eighth NMOS transistor MN8 may be gated by the voltage of the dynamic node ZZ1. The seventh NMOS transistor MN7 may be gated by the delayed clock signal CKD.

The clock-based inverter (MP5, MN7, MN8) may either maintain the voltage of the static node ZZ2 or invert the voltage of the dynamic node ZZ1, and provide the inverted voltage of the dynamic node ZZ1 to the static node ZZ2 in accordance with the level of the delayed clock signal CKD.

In an example, the clock-based inverter (MP5, MN7, MN8) maintains the voltage of the static node ZZ2 regardless of the voltage of the dynamic node ZZ1 in response to the delayed clock signal CKD having the second level (for example, the logic low level) and may invert the voltage of the dynamic node ZZ1 and provide the inverted voltage of the dynamic node ZZ1 to the static node ZZ2 in response to the delayed clock signal CKD having the first level (for example, the logic high level).

The ninth NMOS transistor MN9 is gated by an inverted voltage of the static node ZZ2, and connects the static node ZZ2 and the eighth NMOS transistor MN8. The sixth and seventh PMOS transistors MP6 and MP7 are connected in series between the power source and the static node ZZ2. The sixth PMOS transistor MP6 is gated by the inverted voltage of the static node ZZ2, and connects the power source and the seventh PMOS transistor MP7. The seventh PMOS transistor MP7 is gated by the delayed clock signal CKD, and connects the sixth PMOS transistor MP6 and the static node ZZ2.

The eighth gate G8 inverts the voltage of the static node ZZ2, and provides the inverted voltage of the static node ZZ2 to the ninth NMOS transistor MN9. The ninth NMOS transistor MN9, the sixth and seventh PMOS transistors MP6 and MP7 and the eighth gate G8 perform a latch function together and may thus prevent signal fights in the static node ZZ2.

As an alternative to the example shown in FIG. 5, the latch circuit 40 may have a structure shown in FIG. 6, i.e., may include eighth and ninth gates G8 and G9 that are cross-coupled.

Referring to FIG. 6, the latch circuit 40 may include the eighth and ninth gates G8 and G9 which perform a NAND operation.

The ninth gate G9 may perform a NAND operation on the voltage of the static node ZZ2 and the inverted clock signal CKB. The eighth gate G8 may develop the voltage of the static node ZZ2 by performing a NAND operation on the voltage of the dynamic node ZZ1 and the output of the ninth gate G9.

The eighth and ninth gates G8 and G9, which are cross-coupled, may prevent signal fights in the latch circuit 40. In an example, during transition of the dynamic node ZZ1, the output of the ninth gate G9 may be shifted to the first level (for example, the logic high level) in accordance with the inverted clock signal CKB. In this example, in a case in which the voltage of the static node ZZ2 has the second level (for example, the logic low level), no toggling occurs because the output of the ninth gate G9 has the first level (for example, the logic high level). Accordingly, the output of the ninth gate G9 is toggled in accordance with the voltage of the static node ZZ2, thereby reducing the power consumption of the semiconductor circuit 1 as compared to a case in which the output of the ninth gate G9 is toggled whenever the level of the clock signal CK is shifted.

In the example shown in FIG. 5, the delayed clock signal is provided for synchronization of the latch circuit 40. In the example shown in FIG. 6, the clock signal CK is provided for synchronization of the latch circuit 40. However, exemplary embodiments are not restricted to the examples of FIGS. 5 and 6.

That is, various types of clock signals (for example, XCK of FIGS. 1 and 2) may also be provided for synchronization of the latch circuit 40. The various types of clock signals may include, but are not limited to, the clock signal CK, the inverted clock signal CKB, the read pulse P, and the inverted read pulse PB.

The buffer circuit 50 buffers the output of the read circuit (10, 20) and outputs the buffered output of the read circuit (10, 20). More specifically, the buffer circuit 50 may be provided with the output of the latch circuit 40, which is obtained by latching the output of the read circuit (10, 20), may buffer the output of the latch circuit 40, and may output the buffered output of the latch circuit 40.

In an example, the buffer circuit 50 may include an inverter. In this example, the voltage of the static node ZZ2 may be inverted by the buffer circuit 50, and the inverted voltage of the static node ZZ2 may be output by the buffer circuit 50.

The operation of a semiconductor circuit according to an embodiment will now be described with reference to FIGS. 2, 3, 7 and 8.

Figure 7:
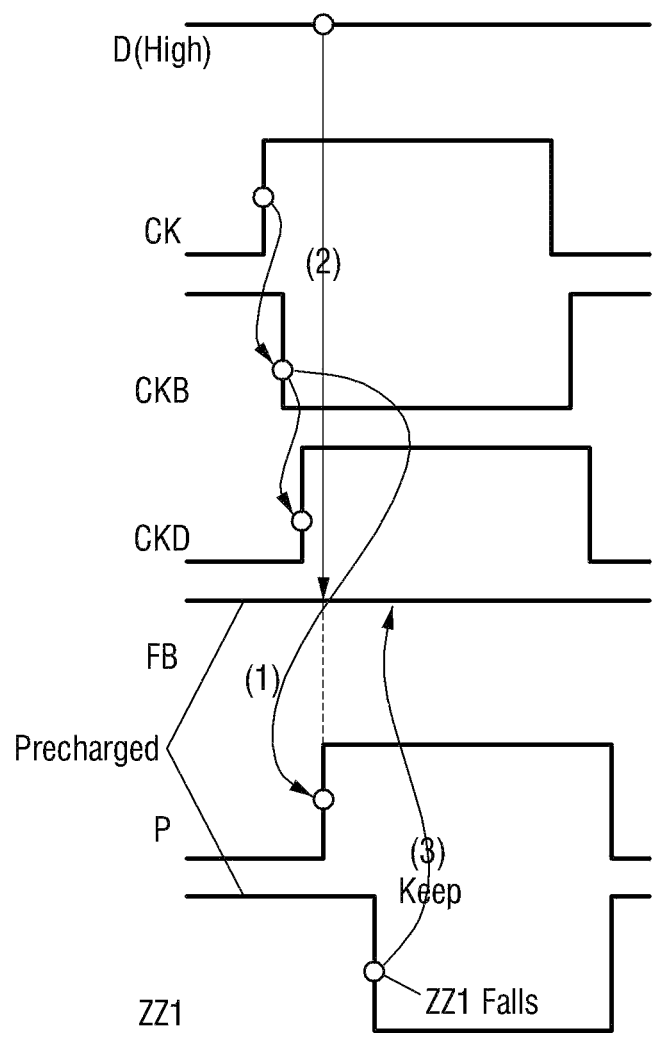
FIGS. 7 and 8 are timing diagrams illustrating the operation of the semiconductor circuit shown in FIG. 1.
Figure 8:
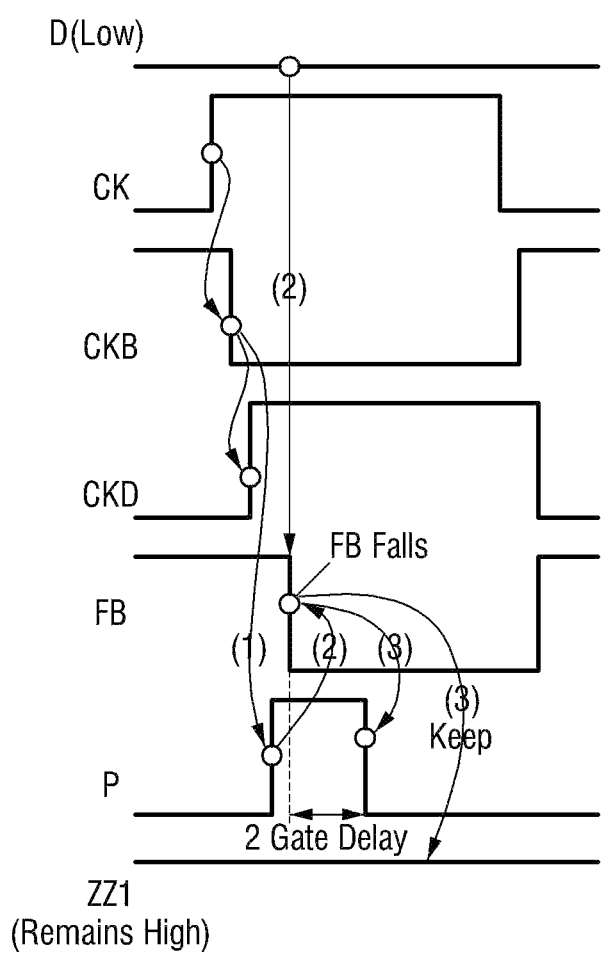

FIGS. 7 and 8 are timing diagrams illustrating the operation of the semiconductor circuit shown in FIG. 1.

The operation of the semiconductor circuit 1, when the input signal D has a data value of 1 will now be described with reference to FIGS. 2, 3 and 7. Referring to FIGS. 2, 3 and 7, the dynamic node ZZ1 and the feedback node FB are pre-charged to the first level (for example, the logic high level) by the first and third PMOS transistors MP1 and MP3 before the rising edge of the clock signal CK.

In response to the rising edge of the clock signal CK, the inverted clock signal CKB is shifted to the second level (for example, the logic low level). When the inverted clock signal CKB is shifted to the second level (for example, the logic low level), the input to the fifth gate G5 becomes (0, 0). Thus, the read pulse P is shifted to the first level (for example, the logic high level), as indicated by reference numeral (1).

Since the input signal D has a data value of 1, the fifth NMOS transistor MN5 is not turned on. Thus, the feedback node FB is maintained at the first level (for example, the logic high level), as indicated by reference numeral (2).

Since the feedback node FB is maintained at the first level (for example, the logic high level), the input to the fifth gate G5 does not change. Thus, no falling edge is generated in the read pulse P. Accordingly, the read pulse P is maintained at the first level (for example, the logic high level) until a falling edge is generated in the clock signal CK.

Since the input signal D has a data value of 1, the first NMOS transistor MN1 is turned on, and the dynamic node ZZ1 is shifted to the second level (for example, the logic low level), as indicated by reference numeral (3). As a result, the fourth PMOS transistor MP4 in the third keeper circuit 15 and the third NMOS transistor MN3 in the second keeper circuit 14 are turned on. Accordingly, the voltages of the feedback node FB and the dynamic node ZZ1 are maintained, regardless of a later change in the data value of the input signal D.

The operation of the semiconductor circuit 1, when the input signal D has a data value of 0 will now be described with reference to FIGS. 2, 3 and 8.

Referring to FIGS. 2, 3 and 8, the dynamic node ZZ1 and the feedback node FB are precharged to the first level (for example, the logic high level) by the first and third PMOS transistors MP1 and MP3, before the rising edge of the clock signal CK.

In response to the rising edge of the clock signal CK, the inverted clock signal CKB is shifted to the second level (for example, the logic low level), and the delayed clock signal CKD is shifted to the first level (for example, the logic high level). When the inverted clock signal CKB is shifted to the second level (for example, the logic low level), the input to the fifth gate G5 becomes (0, 0). Thus, the read pulse P is shifted to the first level (for example, the logic high level), as indicated by reference numeral (1).

Since the input signal D has a data value of 0, the fifth NMOS transistor MN5 is turned on. Thus, the feedback node FB is shifted to the second level (for example, the logic low level), as indicated by reference numeral (2).

Since the feedback node FB is shifted to the second level (for example, the logic low level), the read pulse P is shifted to the second level (for example, the logic low level), as indicated by reference numeral (3), by being delayed for a "two-gate delay" time by the fourth and fifth gates G4 and G5. In other words, a falling edge is generated in the read pulse (P).

Since the input signal D has a data value of 0, the first NMOS transistor MN1 is not turned on. Thus, the dynamic node ZZ1 is maintained at the first level (for example, the logic high level), as indicated by reference numeral (3).

As described above, when the input signal D has a data value of 1, the data hold time of the semiconductor circuit 1 becomes less important because the voltages of the feedback node FB and the dynamic node ZZ1 can be maintained, regardless of a later change in the data value of the input signal D. Also, since the read pulse P is maintained until a falling edge is generated in the clock signal CK, the performance of reading the data value of the input signal D, i.e., writability, can be improved. In this example, if the read pulse P disappears before the generation of a falling edge in the clock signal CK, the data value of the input signal D may not be able to be read.

Alternatively, when the input signal D has a data value of 0, writability becomes less important because the dynamic node ZZ1 is precharged to the first level (for example, the logic high level) by the first PMOS transistor MP1. In this example, since the read pulse P disappears before the generation of a falling edge in the clock signal CK, data hold time decreases accordingly.

In other words, when data hold time does not matter much, the semiconductor circuit 1 can improve writability. On the other hand, when writability does not matter much, the semiconductor circuit 1 can improve reliability by reducing data hold time.

Accordingly, the semiconductor circuit 1 can guarantee high operating reliability even when driven at a low voltage in an environment with severe process variations.

The operation of the semiconductor circuit 1 will now be described in further detail with reference to FIG. 9.

Figure 9:
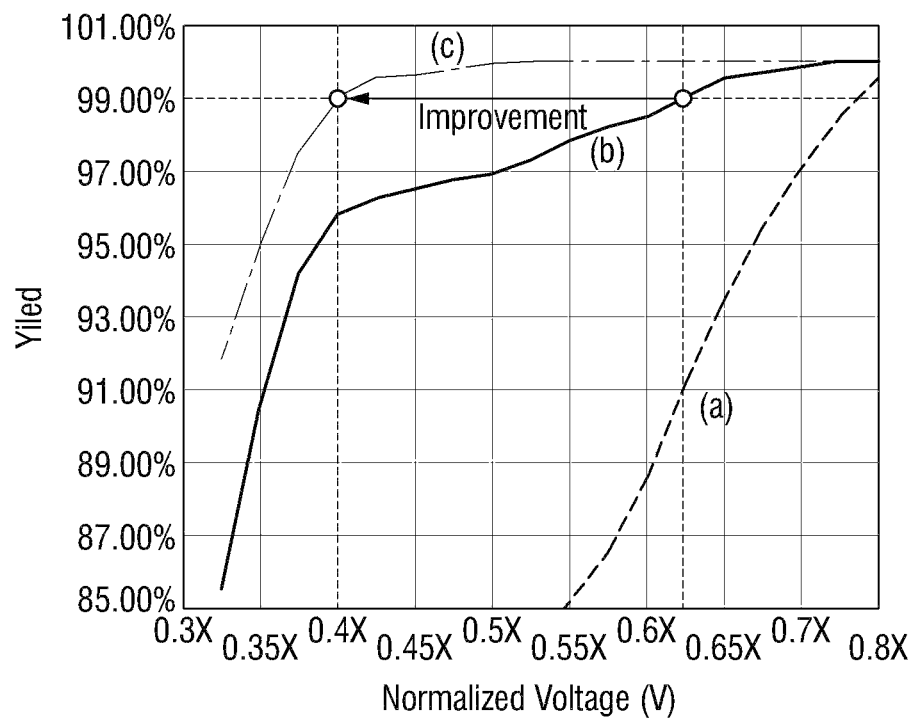
FIG. 9 is a diagram illustrating the effect of the semiconductor circuit shown in FIG. 1.

FIG. 9 is a diagram illustrating the effect of the semiconductor circuit 1. More specifically, FIG. 9 is a graph showing yield measurements obtained from three semiconductor circuits by varying a driving voltage.

Referring to FIG. 9, (a) and (b) represent yield measurements obtained from semiconductor circuits that are driven in a different manner, from a semiconductor circuit according to an embodiment, by varying a driving voltage, and (c) represents yield measurements obtained from a semiconductor circuit that is driven in a same manner as a semiconductor circuit according to an embodiment, by varying a driving voltage.

Referring to FIG. 9, each driving voltage may be obtained by multiplying a predefined constant of, for example, 0.3 to 0.8 to a predetermined reference voltage X, and the yield of a semiconductor circuit may be calculated as a probability in response to the input of particular data (for example, a data value of 1) to each semiconductor circuit, the same data as the particular data output from each semiconductor circuit.

As shown in FIG. 9, semiconductor circuits (a) and (b) achieve similar yields to that of semiconductor circuit (c) when driven at a relatively high driving voltage of, e.g., 0.8× or higher. However, as the driving voltage lowers, the yield of semiconductor circuits (a) and (b) considerably decreases, as compared to semiconductor circuit (c). In other words, semiconductor circuit (b), in particular, requires a driving voltage of, for example, about 0.62×, to achieve a yield of 99%, whereas semiconductor circuit (c) only requires a driving voltage of, for example, about 0.4×, to achieve the same yield. Accordingly, the semiconductor circuit 1 can have improved data readability, and can operate reliably even when driven at a relatively low driving voltage.

A semiconductor circuit according to another embodiment will now be described with reference to FIGS. 10 and 11.

Figure 10:
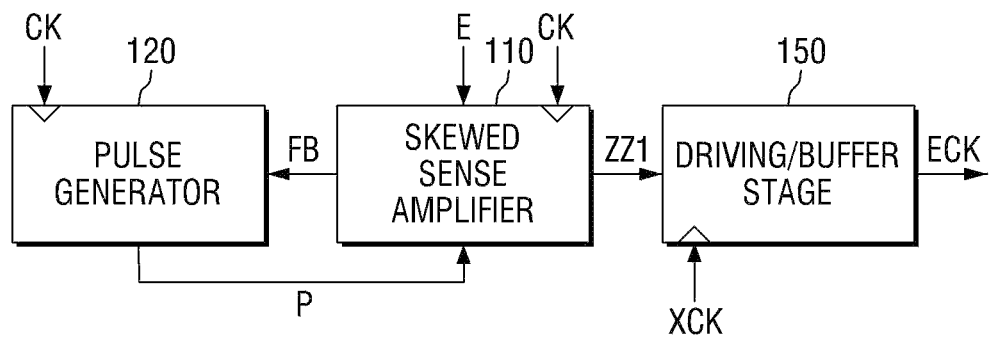
FIG. 10 is a block diagram of a semiconductor circuit according to another embodiment.

FIG. 10 is a block diagram of a semiconductor circuit according to another embodiment. FIG. 11 is a detailed circuit diagram of the semiconductor circuit shown in FIG. 10.

Figure 11:
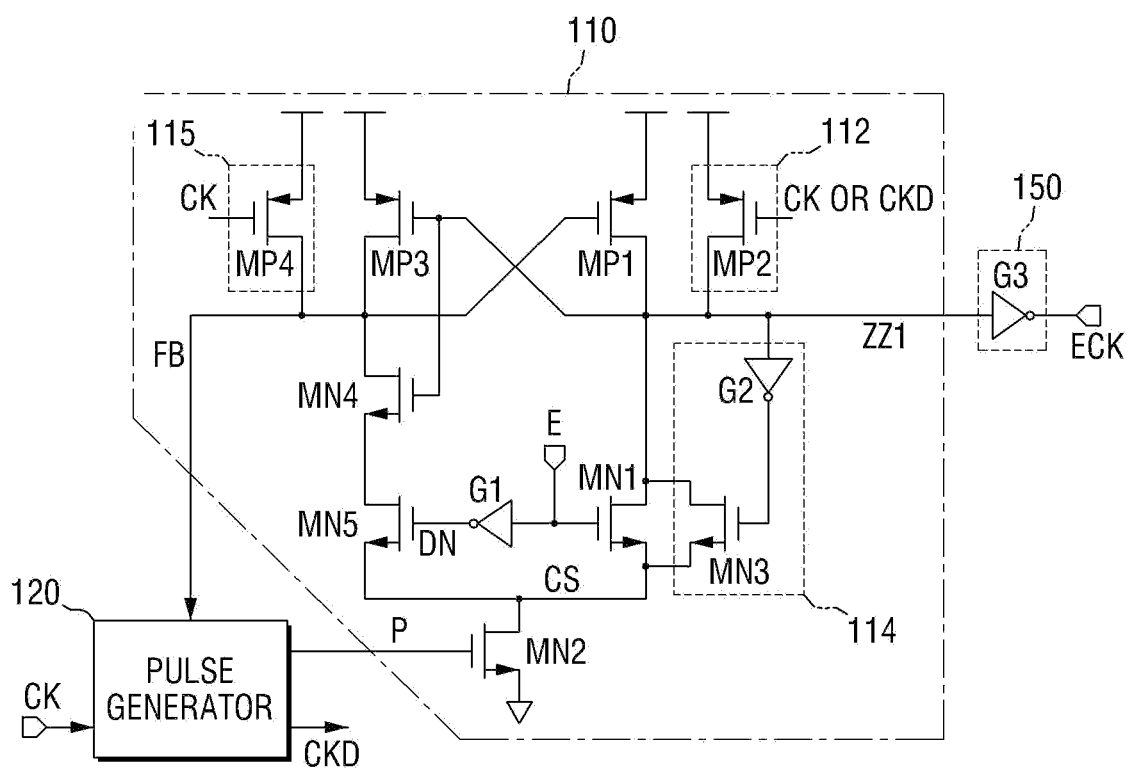
FIG. 11 is a detailed circuit diagram of the semiconductor circuit shown in FIG. 10.

Referring to FIGS. 10 and 11, a semiconductor circuit 2 includes a read circuit (110, 120) and a buffer circuit 150.

In an example, the semiconductor circuit 2 may be a clock gating cell circuit. However, the exemplary embodiments are not restricted to a clock gating cell circuit. In other words, the exemplary embodiments can be applied to various other semiconductor circuits other than a clock gating cell circuit.

The read circuit (110, 120) may be provided with a clock signal CK with a first level (for example, a logic high level), may generate a read pulse P, which varies depending on the data value of an enable signal E, and may read the data value of the enable signal E by using the read pulse P.

The read circuit (110, 120) may include a sense amplifier 110 and a pulse generator 120. The sense amplifier 110 and the pulse generator 120 may be the same as the sense amplifier 10 and the pulse generator 20, respectively, shown in FIG. 2 except that they process the enable signal E, instead of the input signal D. Accordingly, detailed descriptions of the sense amplifier 110 and the pulse generator 120 will be omitted.

The buffer circuit 150 buffers the output of the read circuit (110, 120). In an example, the buffer circuit 150 may include an inverter. In this example, the voltage of a dynamic node ZZ1 may be inverted by the buffer circuit 150, and the inverted voltage of the dynamic node ZZ1 may be output as an enable clock signal ECK.

The operation of the semiconductor circuit according to another embodiment of will now be described with reference to FIGS. 11, 12 and 13.

Figure 12:
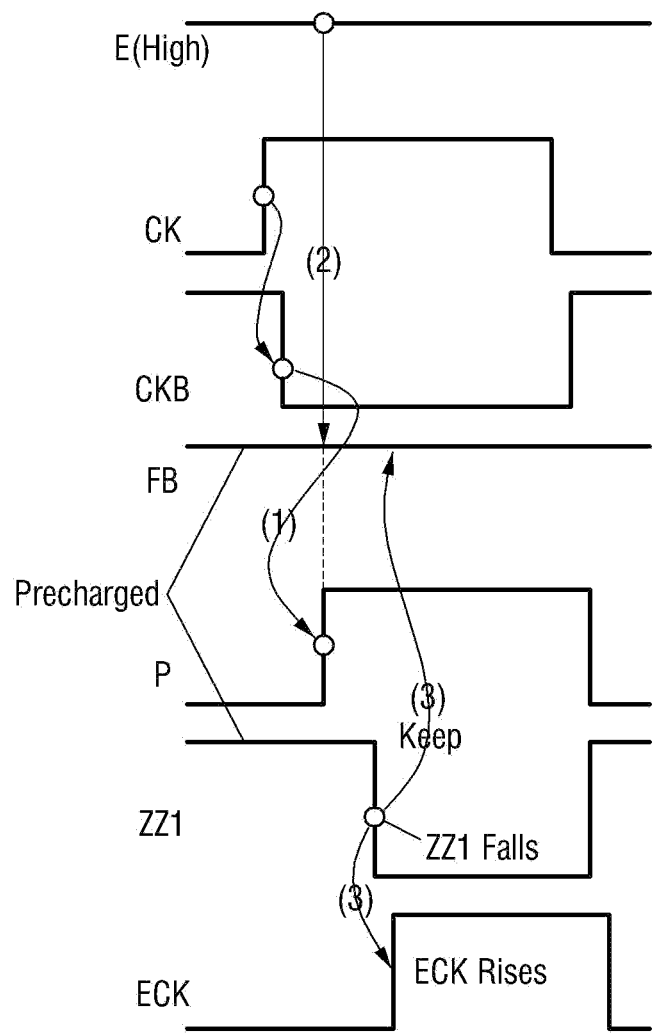
FIGS. 12 and 13 are timing diagrams illustrating the operation of the semiconductor circuit shown in FIG. 10.
Figure 13:
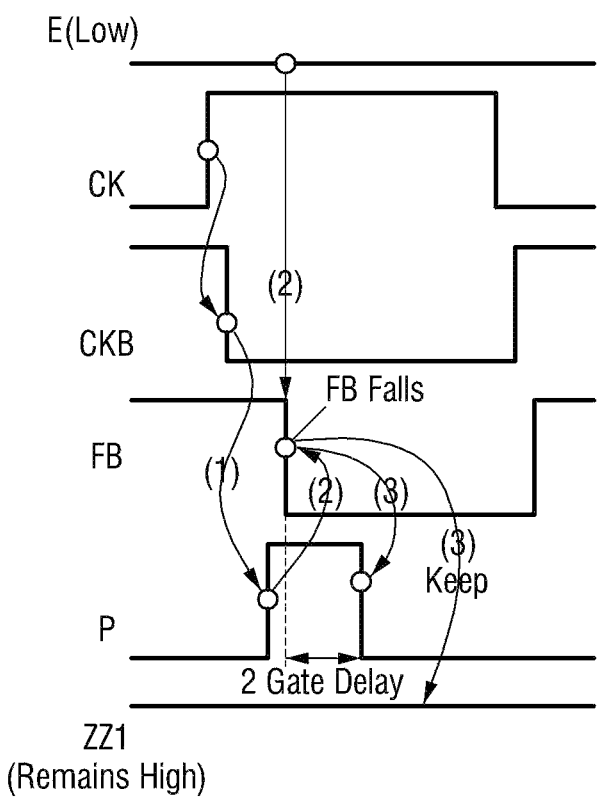

FIGS. 12 and 13 are timing diagrams illustrating the operation of the semiconductor circuit shown in FIG. 10.

The operation of the semiconductor circuit 2 when the enable signal E has a data value of 1 will now be described with reference to FIGS. 11 and 12.

Referring to FIGS. 11 and 12, the dynamic node ZZ1 and a feedback node FB are precharged to a first level (for example, a logic high level) by a first and third PMOS transistors MP1 and MP3 before the rising edge of a clock signal CK.

In response to the rising edge of the clock signal CK, an inverted clock signal CKB is shifted to a second level (for example, a logic low level). When the inverted clock signal CKB is shifted to the second level (for example, the logic low level), the read pulse P is shifted to the first level (for example, the logic high level), as indicated by reference numeral (1).

Since the enable signal E has a data value of 1, a fifth NMOS transistor MN5 is not turned on. Thus, the feedback node FB is maintained at the first level (for example, the logic high level), as indicated by reference numeral (2).

Since the feedback node FB is maintained at the first level (for example, the logic high level), no falling edge is generated in the read pulse P. Accordingly, the read pulse P is maintained at the first level (for example, the logic high level) until a falling edge is generated in the clock signal CK.

Since the enable signal E has a data value of 1, a first NMOS transistor MN1 is turned on, and the dynamic node ZZ1 is shifted to the second level (for example, the logic low level). Accordingly, the enable clock signal ECK is shifted to the first level (for example, the logic high level), as indicated by reference numeral (3).

As a result, a fourth PMOS transistor MP4 in a third keeper circuit 115 and a third NMOS transistor MN3 in a second keeper circuit 114 are turned on. Accordingly, the voltages of the feedback node FB and the dynamic node ZZ1 are maintained regardless of a later change in the data value of the enable signal E.

The operation of the semiconductor circuit 2 when the enable signal E has a data value of 0 will now be described with reference to FIGS. 11 and 13.

Referring to FIGS. 11 and 13, the dynamic node ZZ1 and the feedback node FB are precharged to the first level (for example, the logic high level) by the first and third PMOS transistors MP1 and MP3 before the rising edge of the clock signal CK.

In response to the rising edge of the clock signal CK, the inverted clock signal CKB is shifted to the second level (for example, the logic low level), and a delayed clock signal CKD is shifted to the first level (for example, the logic high level). When the inverted clock signal CKB is shifted to the second level (for example, the logic low level), the read pulse P is shifted to the first level (for example, the logic high level), as indicated by reference numeral (1).

Since the enable signal E has a data value of 0, the fifth NMOS transistor MN5 is turned on. Thus, the feedback node FB is shifted to the second level (for example, the logic low level), as indicated by reference numeral (2).

Since the feedback node FB is shifted to the second level (for example, the logic low level), the read pulse P is shifted to the second level (for example, the logic low level), as indicated by reference numeral (3). In other words, a falling edge is generated in the read pulse (P).

Since the enable signal E has a data value of 0, the first NMOS transistor MN1 is not turned on. Thus, the dynamic node ZZ1 is maintained at the first level (for example, the logic high level). Accordingly, the enable clock signal ECK is maintained at the second level (for example, the logic low level), as indicated by reference numeral (3).

As described above, when data hold time does not matter, the semiconductor circuit 2 can improve writability because the read pulse P is maintained until a falling edge is generated in the clock signal CK. On the other hand, when writability does not matter much, the semiconductor circuit 2 can improve reliability by reducing data hold time because the read pulse P disappears before the generation of a falling edge in the clock signal CK. Accordingly, the semiconductor circuit 2 can guarantee high operating reliability, even when driven at a low voltage in an environment with severe process variations.

A semiconductor circuit according to another embodiment of the present invention will now be described with reference to FIG. 14.

Figure 14:
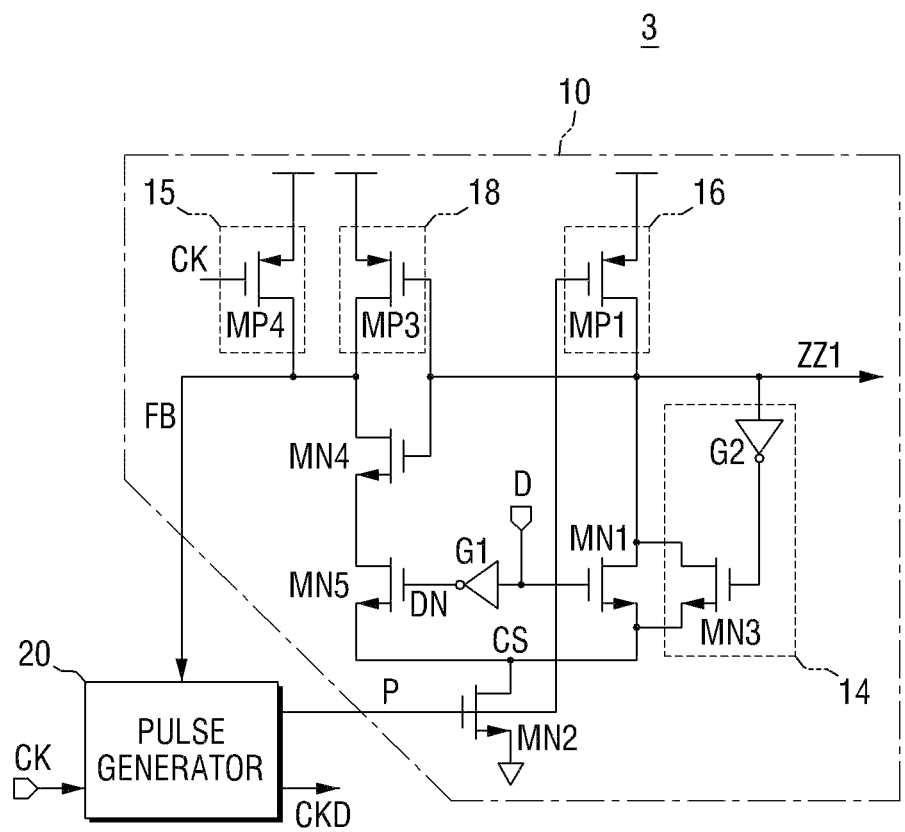
FIG. 14 is a circuit diagram of a semiconductor circuit according to another embodiment.

FIG. 14 is a circuit diagram of a semiconductor circuit according to another embodiment. The current embodiment will be described by focusing on differences with the previous embodiments.

Referring to FIGS. 2, 11 and 14, a semiconductor circuit 3, unlike the semiconductor circuit 1 or 2, includes a single precharge PMOS transistor MP1, which is gated by a read pulse P, instead of two PMOS transistors, i.e., the second PMOS transistor MP2, which is included in the first keeper circuit 12 or 112 and is gated by a clock signal CK or a delayed clock signal CKD, and the first PMOS transistor MP1, which is included in the first transistor stack (MP1, MN1) and precharges the dynamic mode ZZ1.

In other words, in the semiconductor circuit 3, the precharge PMOS transistor MP1, which is included in a first transistor stack (MP1, MN1) and precharges a dynamic node ZZ1, also serves as a first keeper circuit 16.

The semiconductor circuit 3 may operate in the same manner as the semiconductor circuit 1 or 2. More specifically, when an input signal D has a data value of, e.g., 1, a feedback node FB and the read pulse P are both maintained at a first level (for example, a logic high level) while a clock signal CK is maintained at the first level (for example, the logic high level). Accordingly, even with differences in structure with the semiconductor circuit 1 or 2, the semiconductor circuit 3 may operate in the same manner as the semiconductor circuit 1 or 2.

When the input signal D has a data value of, e.g., 0, the feedback node FB is switched to a second level (for example, a logic low level) while the clock signal CK is maintained at the first level (for example, the logic high level). The read pulse P is switched to the second level (for example, the logic low level), is delayed by, e.g., two gates, and is shifted from the first level (for example, the logic high level) to the second level (for example, the logic low level). Accordingly, even with differences in structure with the semiconductor circuit 1 or 2, the semiconductor circuit 3 may operate in the same manner as the semiconductor circuit 1 or 2.

As shown in FIG. 14, by reducing the number of transistors included in a sense amplifier 10, the area of the sense amplifier 10 can be reduced. Thus, a miniaturized semiconductor device can be implemented.

A semiconductor circuit according to another embodiment will now be described with reference to FIG. 15.

Figure 15:
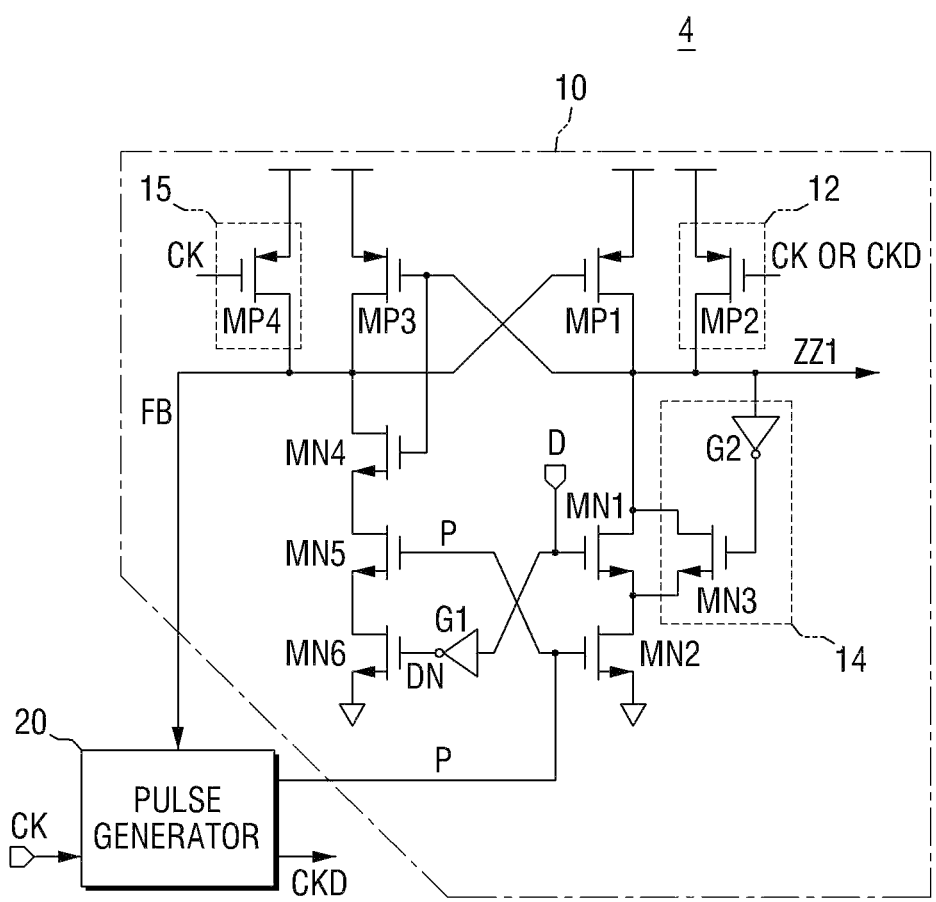
FIG. 15 is a circuit diagram of a semiconductor circuit according to another embodiment.

FIG. 15 is a circuit diagram of a semiconductor circuit according to another embodiment. The current embodiment will now be described by focusing on differences with the previous embodiments.

Referring to FIG. 15, a semiconductor circuit 4 is different from the semiconductor circuit 1 or 2 in that a discharge transistor (i.e., the second NMOS transistor MN2 of FIG. 2 or 11) is divided into two transistors, i.e., second and fifth NMOS transistors MN2 and MN5.

More specifically, referring to FIGS. 2, 11 and 15, in the semiconductor circuit 4, a first transistor stack (MP1, MN1)

and a second transistor stack (MP3, MN4, MN5) are connected to different discharge transistors, i.e., the second and fifth NMOS transistors MN2 and MN5, respectively. In the semiconductor circuit 1 or 2, the first transistor stack (MP1, MN1) and the second transistor stack (MP3, MN4, MN5) share the common node CS, and are both connected to the same discharge transistor, i.e., the second NMOS transistor MN2.

According to the embodiment shown in FIG. 15, it is possible to improve the operating speed of a semiconductor circuit. More specifically, in the semiconductor circuit 1 or 2, the common node CS is precharged all the time by the dynamic node ZZ1 or the feedback node FB. Accordingly, data setup time for reading the data value of the input signal D may increase. On the other hand, in the semiconductor circuit 4, two separate discharge transistors (i.e., the second and fifth NMOS transistors MN2 and MN5), instead of a single discharge transistor (i.e., the second NMOS transistor MN2 of FIG. 2 or 11), are provided, and no common node CS is provided. Accordingly, data setup time for reading the data value of the input signal D may decrease.

A semiconductor circuit according to another embodiment will now be described with reference to FIGS. 16 and 17.

Figure 16:
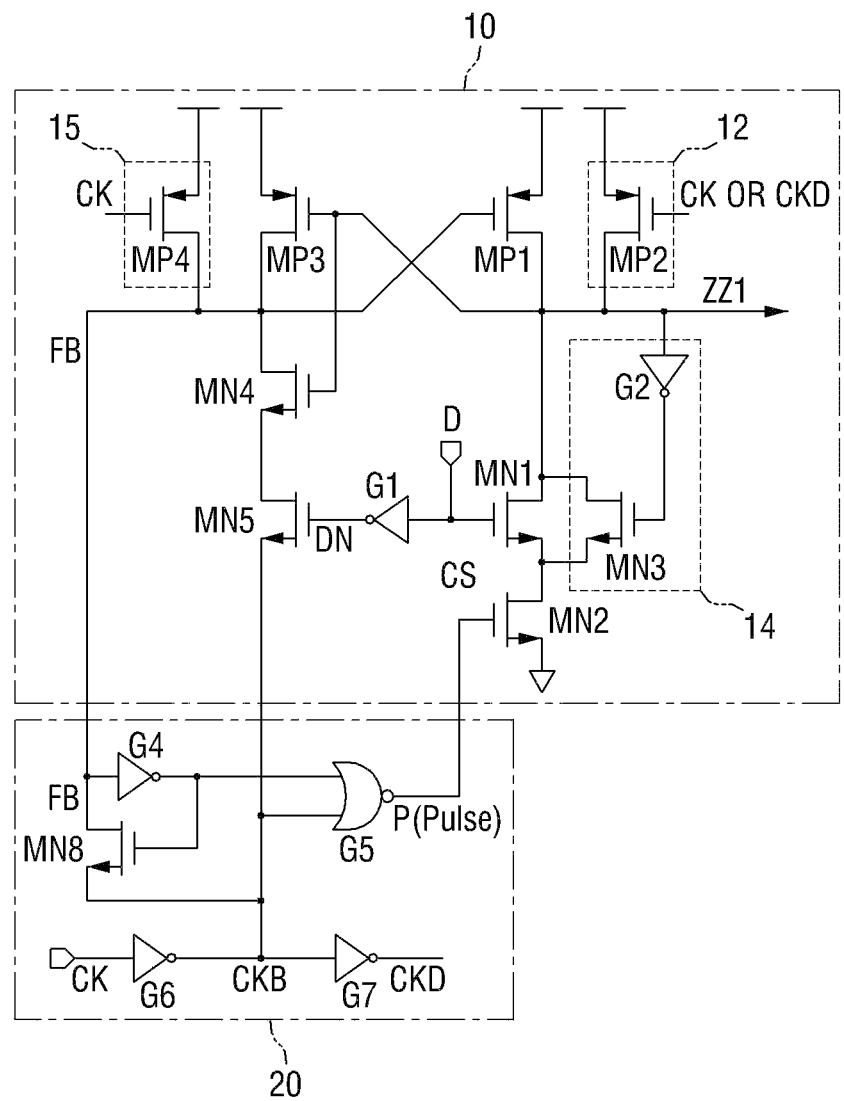
FIG. 16 is a circuit diagram of a semiconductor circuit according to another embodiment.
Figure 17:
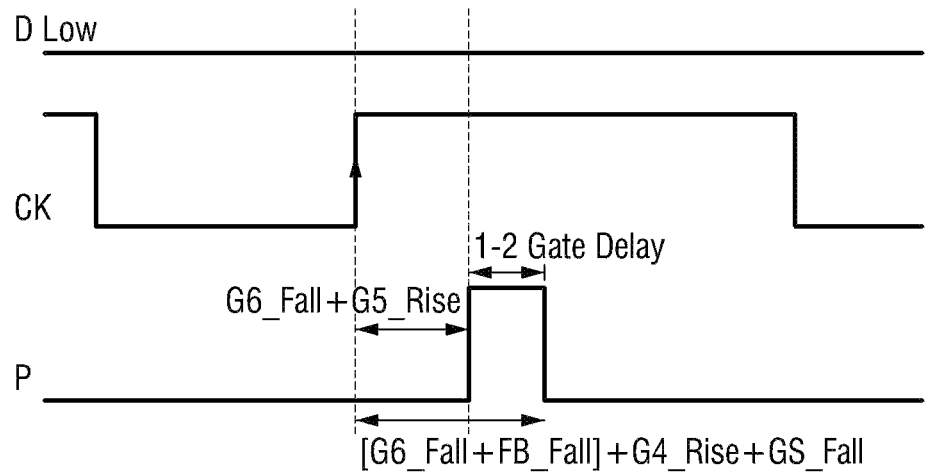
FIG. 17 is a timing diagram illustrating the operation of the semiconductor circuit shown in FIG. 16.

FIG. 16 is a circuit diagram of a semiconductor circuit according to another embodiment, and FIG. 17 is a timing diagram illustrating the operation of the semiconductor circuit shown in FIG. 16.

Referring to FIG. 16, a semiconductor circuit 5 is different from the semiconductor circuit 1 or 2 in that a fifth NMOS transistor MN5 connects a fourth NMOS transistor MN4 and a pulse generator 20 by being gated by the data value of an inverted input signal DN, instead of being included in a second transistor stack (MP3, MN4, MN5) and connecting the fourth NMOS transistor and a discharge transistor (i.e., a second NMOS transistor MN2) by being gated by the data value of the inverted input signal DN.

According to the embodiment shown in FIG. 16, data hold time may be shortened by reducing the pulse width of a read pulse P generated when an input signal D has a data value of 0.

More specifically, as shown in FIG. 8, in the case of the semiconductor circuit 1 or 2, the read pulse P may be maintained at the first level (for example, the logic high level) while being delayed for a "two-gate delay" time by the fourth and fifth gates G4 and G5. On the other hand, in the case of the semiconductor circuit 5, the read pulse P is maintained at the first level (for example, the logic high level) only for about a "one-gate delay" time ((G4_Rise+G5_Fall)−(G5_Rise)). In other words, the pulse width of the read pulse P may be reduced.

In the embodiment shown in FIG. 16, similar to the previous embodiments, when the input signal D has a data value of 0, the dynamic node ZZ1 is precharged to the first level (for example, the logic high level) by a first PMOS transistor MP1. Accordingly, writability becomes less important, whereas data hold time considerably affects the performance of the semiconductor circuit 5. When the input signal has a data value of 0, the semiconductor circuit 5 can shorten data hold time by reducing the pulse width of the read pulse P from a "two-gate delay" time to a "one-gate delay" time.

A computing system in which the semiconductor circuits 1 to 5 can be employed will now be described with reference to FIG. 18.

Figure 18:
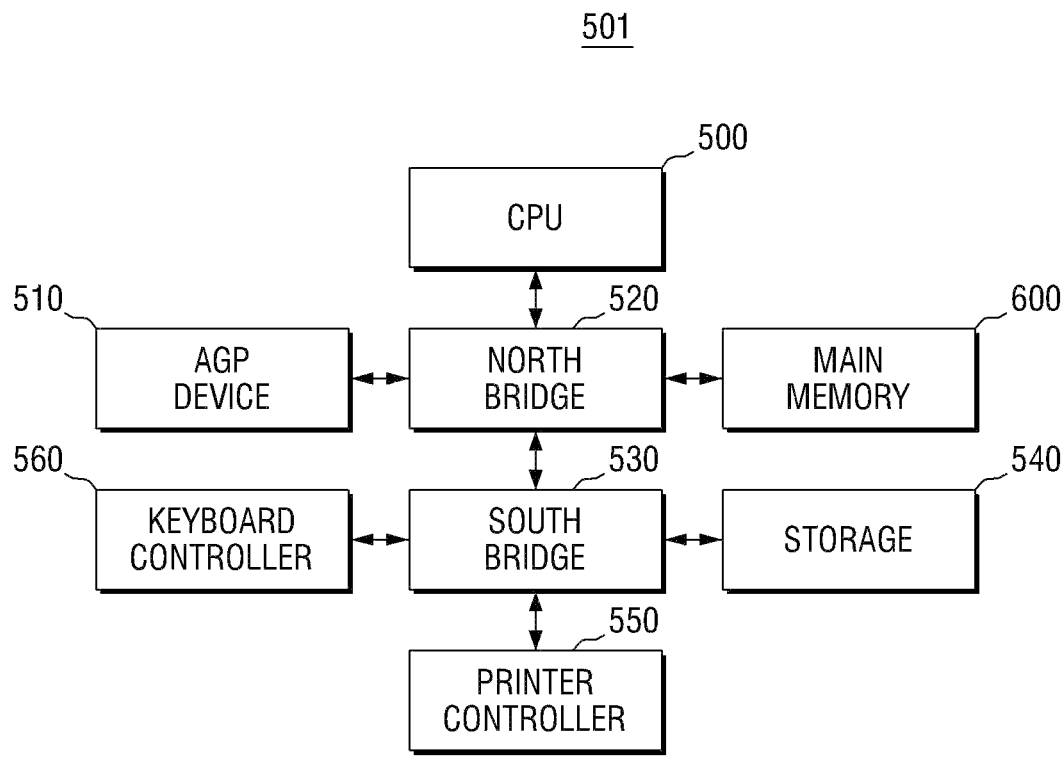
FIG. 18 is a block diagram of a computing system in which semiconductor circuits according to embodiments can be employed.

FIG. 18 is a block diagram of a computing system in which semiconductor circuits according to embodiments can be employed.

Referring to FIG. 18, a computing system 501 includes a central processing unit (CPU) 500, an accelerated graphics port (AGP) device 510, a main memory 600, a storage 540 such as a solid-state drive (SSD), a hard disc drive (HDD), etc., a north bridge 520, a south bridge 530, a keyboard controller 560, and a printer controller 550.

In an example, the computing system 501 may be, but is not limited to, a personal computer (PC) or a laptop computer.

In an example, the CPU 500, the AGP device 510 and the main memory 530 may be connected to the north bridge 520. However, the exemplary embodiments are not limited to this example. The north bridge 520 may be included in the CPU 500.

The AGP device 510 may be a bus specification for rendering 3D graphics at high speed, and may include a video card for reproducing monitor images.

The CPU 500 may perform various computations necessary for the operation of the computing system 101, and may execute an operating system (OS) and application programs. At least one of the semiconductor circuits 1 to 5 may be employed as part of the CPU 500.

The main memory 600 may load data necessary for the operation of the CPU 500 from the storage 540, and may store the loaded data therein.

The storage 540, the keyboard controller 560, the printer controller 550 and various peripheral devices (not illustrated) may be connected to the south bridge 530.

The storage 540 may be a device for storing large amounts of data such as file data. In an example, the storage 540 may be implemented as, but is not limited to an HDD, an SSD, etc.

The storage 540 is illustrated as being connected to the south bridge 530, but the exemplary embodiments are not limited to the embodiment shown in FIG. 18. In other words, the storage 540 may be connected to the north bridge 520 or may be directly connected to the CPU 500.

An electronic system in which semiconductor circuits according to embodiments can be employed.

Figure 19:
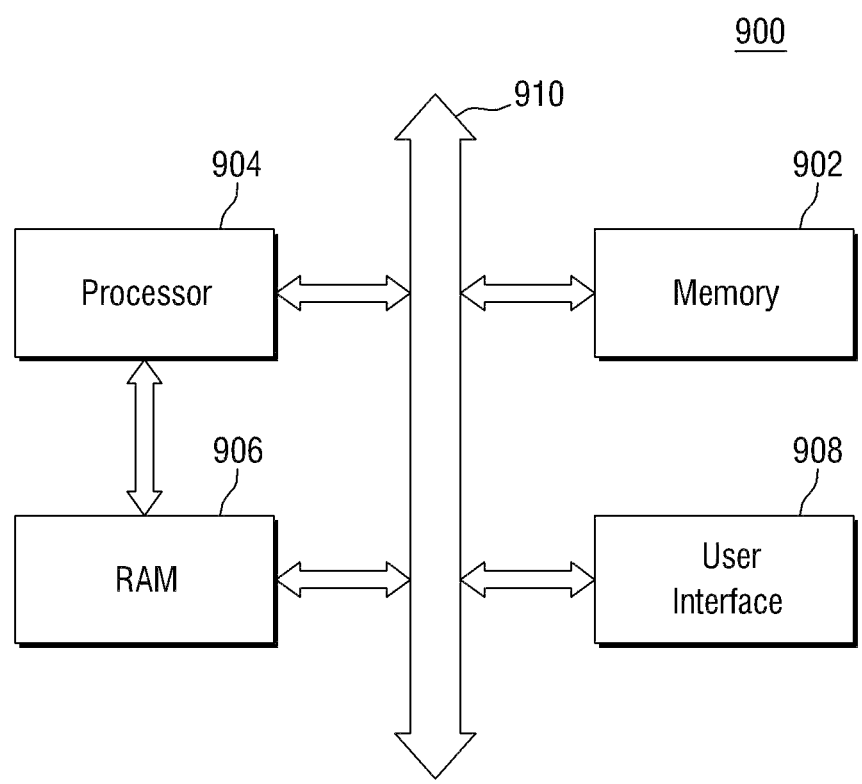
FIG. 19 is a block diagram of an electronic system in which semiconductor circuits according to embodiments can be employed.

FIG. 19 is a block diagram of an electronic system in which semiconductor circuits according to embodiments can be employed.

Referring to FIG. 19, an electronic system 900 may include a memory system 912, a processor 914, a random access memory (RAM) 916 and a user interface 918.

The memory system 912, the processor 914, the RAM 916, and the user interface 917 may communicate data with each other via a bus 920.

The processor 914 may execute programs, and may control the electronic system 900. The RAM 916 may be used as an operating memory for the processor 914. The processor 914 may employ at least one of the semiconductor circuits 1 to 5. The processor 914 and the RAM 916 may be packaged into a single semiconductor device or a semiconductor package.

The user interface 918 may be used to input data to or output data from the electronic system 900.

The memory system 912 may store code for the operation of the processor 914, data processed by the processor 914 or data input thereto from external sources. The memory system 912 may include a controller for driving the memory system 912, and may also include an error correction block. The error correction block may be configured to detect error from data present in the memory system 912 by means of error correction code (ECC), and to correct the detected error.

The memory system 912 may be integrated into a single semiconductor device. The memory system 912 may be integrated into a single semiconductor device so as to form a memory card. In an example, the memory system 912 may be integrated into a single semiconductor device so as to form a memory card, such as a PC memory card international association (PCMCIA) card, a compact flash (CF) card, a smart media (SM) card, a memory stick, a multimedia card (MMC) (such as RS-MMC or MMCmicro), a secure digital (SD) card (such as miniSD, microSC or SDHC), or a universal flash storage (UFS).

Figure 20:
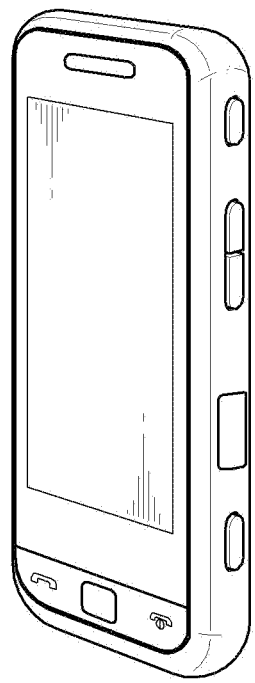
FIG. 20 is a diagram illustrating an example of the application of the electronic system shown in FIG. 19 to a smartphone.

The electronic system 900 may be applied to electronic control devices for various electronic devices. FIG. 20 is a diagram illustrating an example of the application of the electronic system 900. FIG. 20 shows an example of a smartphone 1000. As shown in FIG. 20, in a case in which the electronic system 900 is applied to the smartphone 1000, at least one of the semiconductor circuits 1 to 5 may be employed as part of an application processor (AP).

The electronic system 900 may be provided as a computer, an Ultra Mobile PC (UMPC), a work station, a netbook computer, a Personal Digital Assistant (PDA), a portable computer, a web tablet, a wireless phone, a mobile phone, a smart phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, a device capable of transmitting and receiving data in a wireless environment, one of a variety of electronic devices that constitute a home network, one of a variety of electronic devices that constitute a computer network, one of a variety of electronic devices that constitute a telematics network, a radio frequency identification (RFID) device, or one of a variety of electronic devices that constitute a computing system.

In concluding the detailed description, those skilled in the art will appreciate that many variations and modifications can be made to the preferred embodiments without substantially departing from the principles of the exemplary embodiments. Therefore, the disclosed preferred embodiments of the exemplary embodiments are used in a generic and descriptive sense only and not for purposes of limitation.

What is claimed is:

1. A semiconductor circuit comprising:
a pulse generator which is enabled by a rising edge of a clock signal, and generates a read pulse which varies depending on a voltage of a feedback node; and
a sense amplifier which generates a voltage of a dynamic node and the voltage of the feedback node in accordance with a data value of an input signal using the read pulse,
wherein the sense amplifier comprises:
a first transistor stack which is configured to generate the voltage of the dynamic node in accordance with the data value of the input signal; and
a second transistor stack which is configured to generate the voltage of the feedback node in accordance with the data value of the input signal,
wherein the first transistor stack is different from the second transistor stack in terms of a number of transistors included in the first transistor stack.

2. The semiconductor circuit of claim 1, wherein the pulse generator generates the read pulse with a first width in response to the voltage of the feedback node having a first level, and generates the read pulse with a second width, which is different from the first width, in response to the voltage of the feedback node having a second level, which is different from the first level.

3. The semiconductor circuit of claim 2, wherein the first level is a logic high level, the second level is a logic low level, and the first width is greater than the second width.

4. The semiconductor circuit of claim 1, wherein the first transistor stack is different from the second transistor stack in terms of a size of at least one transistor included in the first transistor stack.

5. The semiconductor circuit of claim 4, wherein the size of the at least one transistor of the first transistor stack is larger than a size of at least one transistor of the second transistor stack.

6. The semiconductor circuit of claim 1, wherein the first transistor stack includes two transistors, and the second transistor stack includes three transistors.

7. The semiconductor circuit of claim 1, wherein the read pulse is delayed for a predetermined amount of time, after the rising edge of the clock signal.

8. The semiconductor circuit of claim 1, wherein the read pulse is delayed by two gates which are included in the pulse generator.

9. A semiconductor circuit comprising:
a read circuit which is provided with a clock signal at a first level, generates a read pulse which varies depending on a data value of an input signal, and reads the data value of the input signal using the read pulse; and
a buffer circuit which buffers a signal output from the read circuit and outputs the buffered output signal,
wherein the read circuit comprises:
a sense amplifier which is provided with the clock signal and the input signal, and generates a voltage of a dynamic node and a voltage of a feedback node such that each voltage of the dynamic node and the feedback node has different levels, depending on the data value of the input signal,
wherein the sense amplifier comprises:
a first transistor stack which is configured to generate the voltage of the dynamic node in accordance with the data value of the input signal; and
a second transistor stack which is configured to generate the voltage of the feedback node in accordance with the data value of the input signal,
wherein the first transistor stack is different from the second transistor stack in terms of a number of transistors included in the first transistor stack.

10. The semiconductor circuit of claim 9, wherein the read circuit generates the read pulse with a first width in response to the input signal having a first data value, and generates the read pulse with a second width, which is different from the first width, in response to the input signal having a second data value, which is different from the first data value.

11. The semiconductor circuit of claim 10, wherein the first data value is 1, the second data value is 0, and the first width is greater than the second width.

12. The semiconductor circuit of claim 9, wherein the clock signal is a logic high level.

13. The semiconductor circuit of claim 9, wherein the read circuit further comprises
a pulse generator which generates the read pulse with a pulse width which varies, depending on the voltage of the feedback node.

14. The semiconductor circuit of claim 9, wherein the buffer circuit includes an inverter.

15. The semiconductor circuit of claim 9, further comprising:
a latch circuit which latches the data value of the input signal read by the read circuit.

16. The semiconductor circuit of claim 15, wherein the latch circuit includes a pseudo static latch.

17. The semiconductor circuit of claim 15, wherein the latch circuit comprises a first negated AND (NAND) gate and a second NAND gate, which are cross-coupled to each other.

18. The semiconductor circuit of claim 15, wherein the semiconductor circuit is a flip-flop circuit.

19. The semiconductor circuit of claim 9, wherein the input signal is an enable signal and the buffered output signal is an enable clock signal.

20. The semiconductor circuit of claim 19, wherein the semiconductor circuit is a clock gating cell circuit.

21. A semiconductor circuit comprising:
   a pulse generator which is enabled by a rising edge of a clock signal and generates a read pulse which varies depending on a voltage of a feedback node;
   a first transistor stack which generates a voltage of a dynamic node such that the dynamic node has different levels, depending on a data value of an enable signal;
   a second transistor stack which generates the voltage of the feedback node such that the feedback node has different levels, depending on the data value of the enable signal; and
   a discharge transistor which is configured to pull down the voltages of the dynamic node and the feedback node by being gated to the read pulse,
   wherein when the data value of the enable signal is 1, the read pulse is maintained until a falling edge is generated in the clock signal.

22. The semiconductor circuit of claim 21, further comprising:
   a first keeper circuit which maintains the voltage of the dynamic node at a logic high level;
   a second keeper circuit which maintains the voltage of the dynamic node at a logic low level;
   a third keeper circuit which maintains the voltage of the feedback node at the logic high level; and
   a fourth keeper circuit which maintains the voltage of the feedback node at the logic low level.

23. The semiconductor circuit of claim 22, wherein the pulse generator includes the fourth keeper circuit.

24. The semiconductor circuit of claim 22, wherein a precharge transistor in the first transistor stack is the first keeper circuit, and the precharge transistor precharges the dynamic node.

25. The semiconductor circuit of claim 21, wherein the first transistor stack, the second transistor stack, and the discharge transistor are connected to a common node.

26. The semiconductor circuit of claim 21, wherein the discharge transistor comprises a first discharge transistor and a second discharge transistor, the first discharge transistor is separate from the second discharge transistor,
   wherein the first transistor stack is connected to the first discharge transistor, and the second transistor stack is connected to the second discharge transistor.

27. A semiconductor circuit comprising:
   a pulse generator which is enabled by a rising edge of a clock signal, and generates a read pulse which varies depending on a voltage of a feedback node; and
   a sense amplifier which generates a voltage of a dynamic node and the voltage of the feedback node in accordance with a data value of an enable signal using the read pulse,
   wherein when the data value of the enable signal is 1, the read pulse is maintained until a falling edge is generated in the clock signal.

28. The semiconductor circuit of claim 27, wherein when the data value of the enable signal is 0, the read pulse disappears before a falling edge is generated in the clock signal.

* * * * *